US011012264B2

(12) United States Patent
Kattamuri et al.

(10) Patent No.: US 11,012,264 B2
(45) Date of Patent: May 18, 2021

(54) LINE DRIVER CIRCUIT

(71) Applicant: TEXAS INSTRUMENTS INCORPORATED, Dallas, TX (US)

(72) Inventors: Rama Santosh Neelim Kumar Kattamuri, Bengaluru (IN); Sumantra Seth, Bengaluru (IN); Vikram Sharma, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/701,717

(22) Filed: Dec. 3, 2019

(65) Prior Publication Data

US 2020/0267028 A1 Aug. 20, 2020

(30) Foreign Application Priority Data

Feb. 20, 2019 (IN) .............................. 201941006630

(51) Int. Cl.
*H04L 25/02* (2006.01)
*H03F 3/21* (2006.01)
*H03F 3/45* (2006.01)
*H04L 25/49* (2006.01)

(52) U.S. Cl.
CPC .......... *H04L 25/0272* (2013.01); *H03F 3/211* (2013.01); *H03F 3/45071* (2013.01); *H04L 25/4919* (2013.01)

(58) Field of Classification Search
CPC .. H03F 3/211; H03F 3/45071; H04L 25/0272; H04L 25/4919
USPC .................................................... 379/399.01
See application file for complete search history.

(56) References Cited

U.S. PATENT DOCUMENTS

| | | | |
|---|---|---|---|
| 6,433,637 B1* | 8/2002 | Sauer | H03F 3/303 330/255 |
| 7,474,153 B1* | 1/2009 | Dasgupta | H03F 3/3022 330/255 |
| 2009/0303210 A1* | 12/2009 | Nishimura | G09G 3/3688 345/204 |
| 2019/0173439 A1* | 6/2019 | Dunworth | H03F 3/245 |

* cited by examiner

*Primary Examiner* — Hemant S Patel
(74) *Attorney, Agent, or Firm* — John R. Pessetto; Charles A. Brill; Frank D. Cimino

(57) ABSTRACT

A line driver circuit includes a first input terminal, a second input terminal, a first input stage, a second input stage, a first output stage, and a second output stage. The first input stage includes a first input coupled to the first input terminal, and a second input coupled to the second input terminal. The second input stage includes a first input coupled to the first input terminal, and a second input coupled to the second input terminal. The first output stage includes a first input coupled to a first output terminal of the first input stage and a second input coupled to a first output terminal of the first input stage. A second output stage includes a first input coupled to a second output terminal of the first input stage and a second input coupled to a second output terminal of the first input stage.

14 Claims, 5 Drawing Sheets

LINE DRIVER CIRCUIT

CROSS-REFERENCE TO RELATED APPLICATIONS

The present application claims priority to India Provisional Patent Application No. 201941006630, filed Feb. 20, 2019, entitled "A Highly Linear Line Driver for Automotive Gigabit Ethernet with Integrated Common Mode Termination," which is hereby incorporated herein by reference in its entirety.

BACKGROUND

As the functionality implemented in vehicles, such as automobiles, increases, the bandwidth required for intra-vehicular data communication also increases. For example, video data, audio data, sensor measurements, engine and transmission control data, etc. are communicated from one system to another in a vehicle. Automotive Ethernet technology is being applied to provide the bandwidth needed to support a wide range of vehicle functions, while reducing the cost and complexity of intra-vehicular communication systems.

SUMMARY

A class-AB line driver suitable for use in automotive Ethernet systems is disclosed herein. In one example, a line driver circuit includes a first input terminal, a second input terminal, a first input stage, a second input stage, a first output stage, and a second output stage. The first input stage includes a first input coupled to the first input terminal, and a second input coupled to the second input terminal. The second input stage includes a first input coupled to the first input terminal, and a second input coupled to the second input terminal. The first output stage includes a first input coupled to a first output terminal of the first input stage, a second input coupled to a first output terminal of the first input stage, and a first output. A second output stage includes a first input coupled to a second output terminal of the first input stage, a second input coupled to a second output terminal of the first input stage, and a second output.

In another example, a line driver circuit includes a first differential input stage, a second differential input stage, a first output stage, and a second output stage. The first differential input stage is configured to receive a differential input signal. The second differential input stage is configured to receive the differential input signal. The first output stage is coupled to the first differential input stage and the second differential input stage, and is configured to generate a positive signal portion of a differential output signal based on a first signal generated by the first differential input stage and a second signal generated by the second differential input stage. The second output stage is coupled to the first differential input stage and the second differential input stage, and is configured to generate a negative signal portion of the differential output signal based on a third signal generated by the first differential input stage and a fourth signal generated by the second differential input stage.

In a further example, a class AB automotive Ethernet driver includes a first input terminal, a second input terminal, a first differential input stage, a second differential input stage, a first output stage, a second output stage, a common mode termination network, a first output terminal, and a second output terminal. The first input terminal and the second input terminal are configured to receive a differential input signal. The first differential input stage is configured to receive the differential input signal. The second differential input stage is configured to receive the differential input signal. The first output stage is coupled to the first differential input stage and the second differential input stage, and is configured to generate a positive signal portion of a differential output signal based on a first signal generated by the first differential input stage and a second signal generated by the second differential input stage. The second output stage is coupled to the first differential input stage and the second differential input stage, and is configured to generate a negative signal portion of the differential output signal based on a third signal generated by the first differential input stage and a fourth signal generated by the second differential input stage. The first output terminal is coupled to the first output stage via the common mode termination network. The second output terminal is coupled to the second output stage via the common mode termination network.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Automotive Ethernet (class-AB output stage 1000 Base-T1) supports 15 meter full duplex operation over a single twisted pair. Line drivers suitable for use in automotive Ethernet operate at 750 mega-samples-per-second with 1 volt peak-peak output signal swing. Due to full duplex operation, signal swing at the line driver outputs can double, dictating a stringent linearity specification. The line drivers are implemented as class AB circuits to reduce power consumption.

Figure 1:
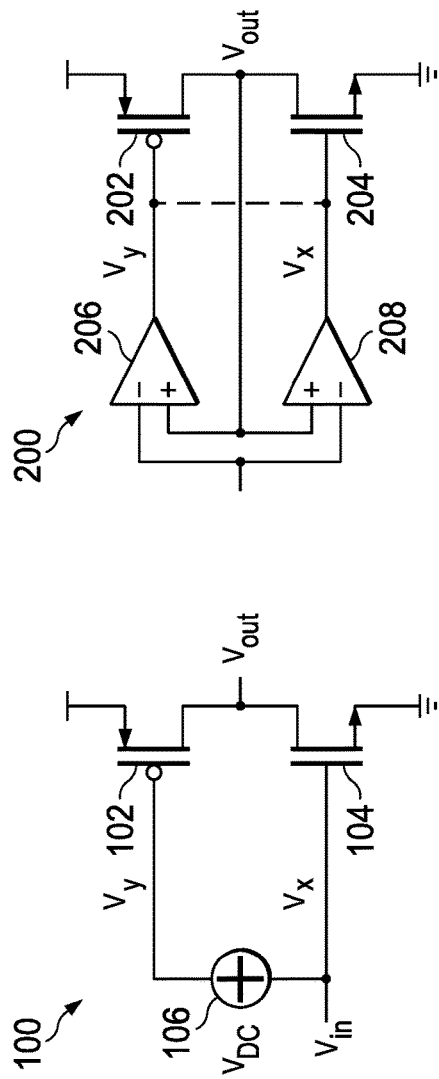
FIG. 1 shows an example class AB output stage with a bias circuit to level shift input signal.

Class-AB drivers provide better power efficiency then class-A drivers at the cost of degraded linearity. FIG. 1 shows an example class-AB output stage 100. The class-AB output stage 100 includes output transistors 102 and 104. The bias circuit 106 level shifts input signal (Vin) to control the output transistors 102 and 104 for class-AB operation. Some implementations of the class-AB output stage 100 use Monticelli biasing to provide the level shifting. However, such biasing adds distortion and inserts an addition pole in the signal path.

Figure 2:
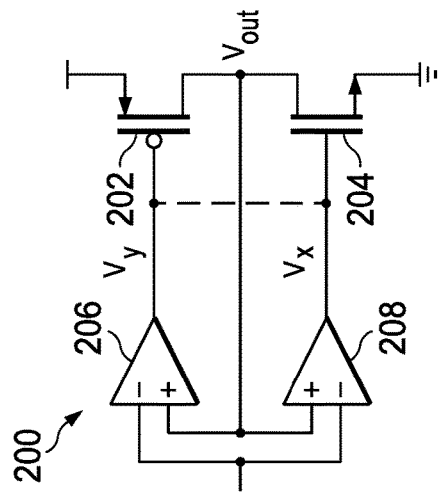
FIG. 2 shows an example class AB output stage with amplifiers driving the output transistors, and no level shifting circuitry.

Rather than level shifting circuitry, an implementation of a class-AB driver circuit uses two amplifiers with similar bandwidth and DC gain to independently drive the output transistors. FIG. 2 shows a class-AB output stage 200 with amplifiers driving the output transistors, and no level shifting circuitry. The amplifier 206 drives the output transistor 202 and the amplifier 208 drives the output transistor 204, creating a virtual short between the gate terminals of the output transistor 202 and the output transistor 204. The class-AB output stage 200 does not distort the output signal when input signal swing is high, and does not add a pole to the signal path. However, the class-AB output stage 200 does not provide precise control of quiescent current. Implementations of the class-AB driver circuit disclosed herein eliminate level shift circuitry to reduce distortion while providing precise output quiescent current. Some implementations of the class-AB driver circuit disclosed herein provide about 18.8 dB of improvement in linearity performance relative to other class-AB drivers with similar power consumption.

Maintaining electromagnetic compatibility between in-vehicle systems mandates that common mode signal on Ethernet conductors be made as small as possible. Common mode signal is produced by mismatch of signal rise and fall times at the driver output. Some systems include a common mode choke at the driver outputs to suppress common mode signal. The common mode choke performs best when both input and output ports of the common mode choke see a common mode termination. A common mode termination network is connected between the common mode choke and the cabling. However, because the impedance looking into the line driver is high, the rejection provided by the common mode choke is unduly limited. The class-AB line driver circuit disclosed herein includes an integrated termination network that sets the impedance looking into the driver circuit from the common mode choke. The termination network provides about 2 decibels (dB) of reduction in common mode signal in some systems that include the class-AB line driver circuit.

Figure 3:
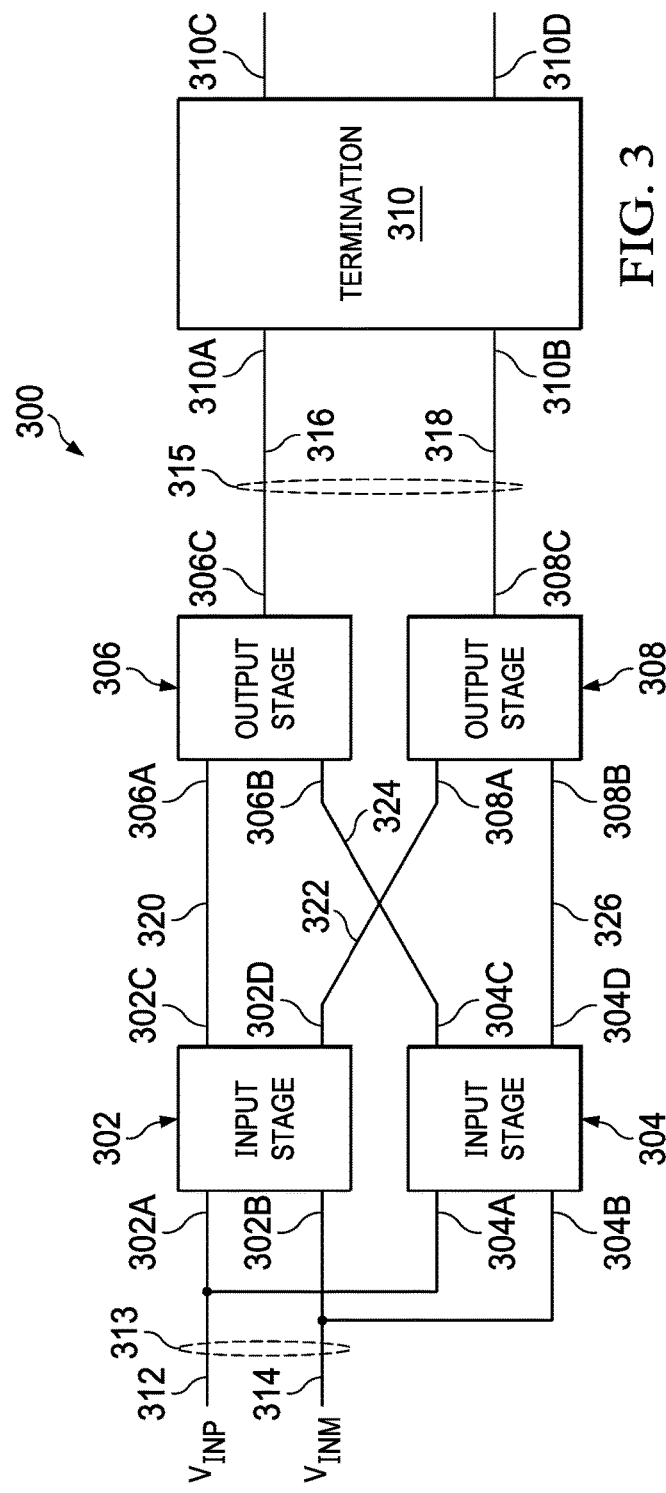
FIG. 3 shows a block diagram for an example class-AB line driver circuit in accordance with this description.

FIG. 3 shows a block diagram for a class-AB line driver circuit 300 in accordance with this description. The 300 is an implementation of a class-AB automotive Ethernet driver. The class-AB line driver circuit 300 includes an input terminal 312, an input terminal 314, a differential input stage 302, a differential input stage 304, an output stage 306, an output stage 308, a termination network 310, an output terminal 310C, and an output terminal 310D. The class-AB line driver circuit 300 receives a differential input signal 313 via the input terminal 312 and the input terminal 314. The differential input stage 302 includes an input 302A coupled to the input terminal 312 and an input 302B coupled to the input terminal 314 for receipt of the differential input signal 313. The differential input stage 304 includes an input 304A coupled to the input terminal 312 and an input 304B coupled to the input terminal 314 for receipt of the differential input signal 313. The differential input stage 302 produces a differential output signal comprising signal 320 and signal 322, and the differential input stage 304 produces a differential output signal comprising signal 324 and 326.

The differential input stage 302 and the differential input stage 304 are coupled to the output stage 306 and the output stage 308. The output stage 306 includes an input 306A coupled to an output terminal 302C of the differential input stage 302 for receipt of the signal 320, and an input 306B coupled to an output terminal 304C of the differential input stage 304 for receipt of the signal 324. The output stage 308 includes an input terminal 308A coupled to an output 302D of the differential input stage 302 for receipt of the signal 322, and an input 308B coupled to an output 304D of the differential input stage 304 for receipt of the signal 326.

The output stage 306 generates the signal 316 (the positive portion of the differential signal 315) based on the signal 320 and the signal 324, and the output stage 308 generates the signal 318 (the negative portion of the differential signal 315) based on the signal 322 and the signal 326. The termination network 310 is coupled to the output stage 306 and the output stage 308. The termination network 310 includes an input terminal 310A coupled to the output terminal 306C of the output stage 306 and an input terminal 310B coupled to the output terminal 308C of the output stage 308 for receipt of the differential signal 315. The termination network 310 couples the output stage 306 and the output stage 308 to the output terminal 310C and the output terminal 310D. Output of the class-AB line driver circuit 300 is taken from the output terminal 310C and the output terminal 310D.

Figure 4:
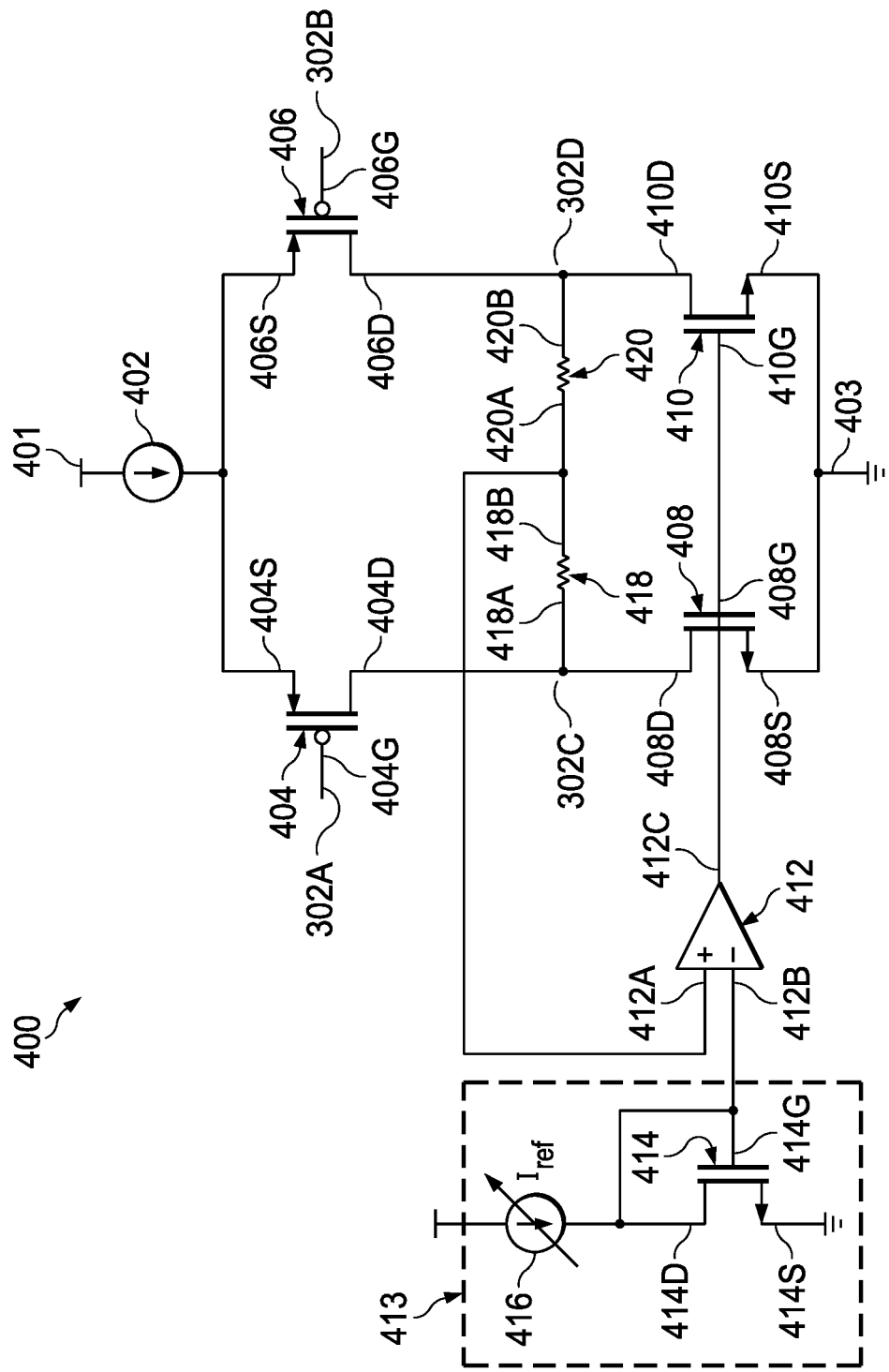
FIGS. 4 and 5 show schematic diagrams for example differential input stages of a class-AB line driver circuit in accordance with this description.

FIG. 4 shows a schematic diagram for an example input stage 400 in accordance with this description. The input stage 400 is an implementation of the differential input stage 302. The input stage 400 includes a current source 402, an input transistor 404, an input transistor 406, a drive transistor 408, a drive transistor 410, an amplifier circuit 412, a reference circuit 413, a resistor 418, and a resistor 420.

The input transistor 404 includes a source terminal 404S coupled to the current source 402 and a gate terminal 404G coupled to the input 302A for receipt of the differential input signal 313. The input transistor 406 includes a source terminal 406S coupled to the current source 402 and a gate terminal 406G coupled to the input 302B for receipt of the differential input signal 313. The input transistor 404 and the input transistor 406 are P-channel metal oxide semiconductor field effect transistors (MOSFETs) in some implementations of the input stage 400.

The drive transistor 408 includes a drain terminal 408D coupled to a drain terminal 404D of the input transistor 404 and a source terminal 408S coupled to a common voltage source 403 (e.g., ground). The drive transistor 410 includes a drain terminal 410D coupled to a drain terminal 406D of the input transistor 406 and a source terminal 410S coupled to the common voltage source. A gate terminal 410G of the drive transistor 410 is coupled to a gate terminal 408G of the drive transistor 408. The drive transistor 408 and the drive transistor 410 are N-channel MOSFETs in some implementations of the input stage 400.

The resistor 418 and the resistor 420 are coupled to the drain terminal 404D and the drain terminal 406D for monitoring of the common mode output voltage of the input stage 400. The resistor 418 includes a terminal 418A coupled to the drain terminal 404D of the input transistor 404 and the drain terminal 408D of the drive transistor 408. The resistor 420 includes a terminal 420B coupled to the drain terminal 406D of the input transistor 406 and the drain terminal 410D of the drive transistor 410. A terminal 420A of the resistor 420 is coupled to a terminal 4186 of the resistor 418.

The amplifier circuit 412 monitors the common mode output voltage and controls the drive transistor 408 and drive transistor 410 based on the common mode output voltage and a reference voltage generated by the reference circuit 413. An input terminal 412A of the amplifier circuit 412 is coupled to the terminal 418B of the resistor 418 and the terminal 420A of the resistor 420. The output terminal 412C of the amplifier circuit 412 is coupled to the gate terminal 408G of the drive transistor 408 and the gate terminal 410G of the drive transistor 410.

The reference circuit 413 includes a current source 416 and a transistor 414. The transistor 414 is diode-connected. The source terminal 414S of the transistor 414 is coupled to the common voltage source. The drain terminal 414D and the gate terminal 414G of the transistor 414 are coupled to the current source 416. An input terminal 412B of the amplifier circuit 412 is coupled to the drain terminal 414D of the transistor 414. The transistor 414 is an N-channel MOSFET in some implementations of the input stage 400.

Figure 5:
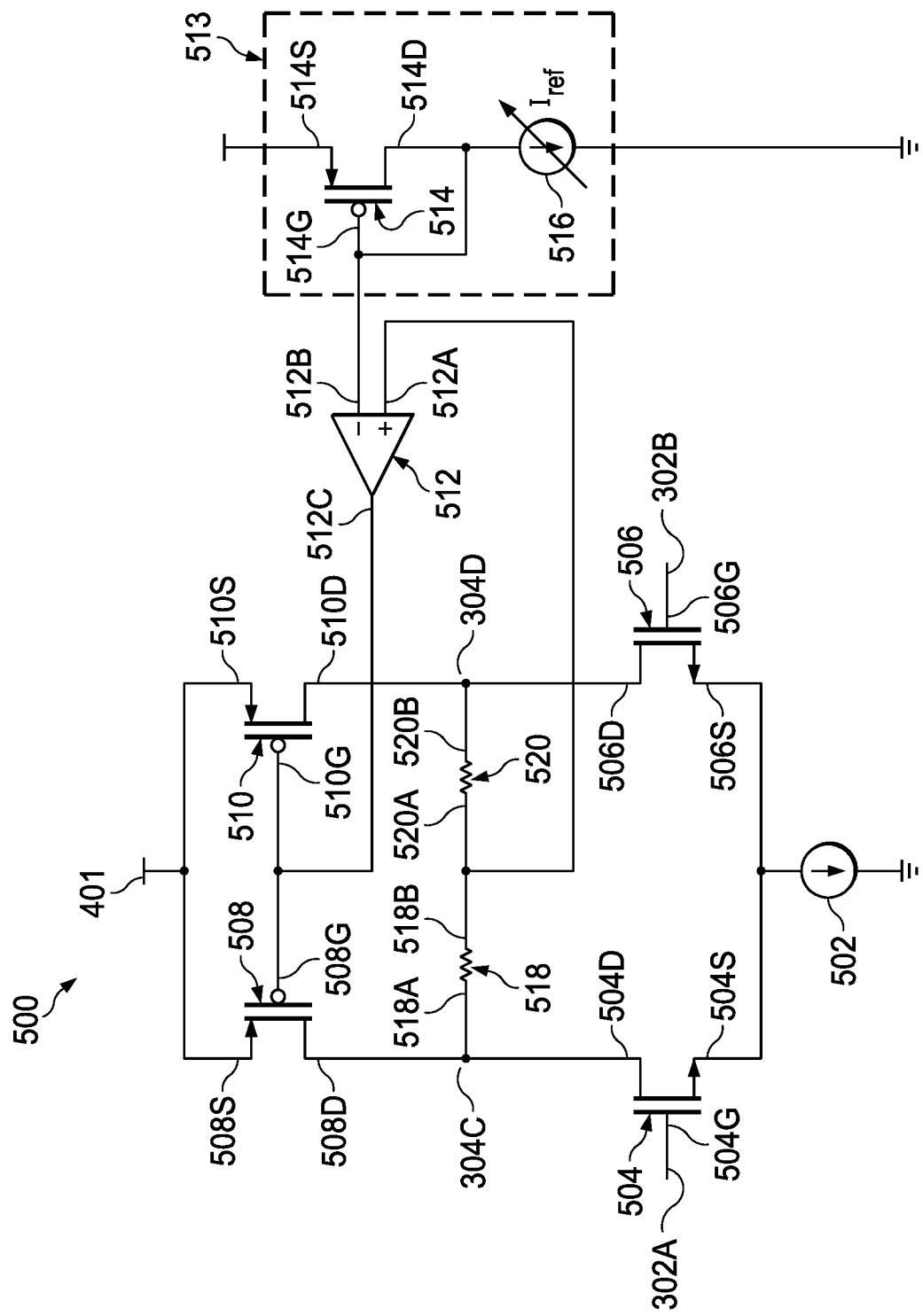

FIG. 5 shows a schematic diagram for an example input stage 500 in accordance with this description. The input stage 500 is an implementation of the differential input stage 304. The input stage 500 includes a current source 502, an input transistor 504, an input transistor 506, a drive transistor 508, a drive transistor 510, an amplifier circuit 512, a reference circuit 513, a resistor 518, and a resistor 520.

The input transistor 504 includes a source terminal 504S coupled to the current source 502 and a gate terminal 504G coupled to the input 302A for receipt of the differential input signal 313. The input transistor 506 includes a source terminal 506S coupled to the current source 502 and a gate terminal 506G coupled to the input 302B for receipt of the differential input signal 313. The input transistor 504 and the input transistor 506 are N-channel MOSFETs in some implementations of the input stage 500.

The drive transistor 508 includes a drain terminal 508D coupled to a drain terminal 504D of the input transistor 504, and a source terminal 508S coupled to a power supply rail 401. The drive transistor 510 includes a drain terminal 510D coupled to a drain terminal 506D of the input transistor 506, and a source terminal 510S coupled to the power supply rail 401. A gate terminal 510G of the drive transistor 510 is coupled to a gate terminal 508G of the drive transistor 508. The drive transistor 508 and the drive transistor 510 are P-channel MOSFETs in some implementations of the input stage 500.

The resistor 518 and the resistor 520 are coupled to the drain terminal 504D and the drain terminal 506D for monitoring the common mode output voltage of the input stage 500. The resistor 518 includes a terminal 518A coupled to the drain terminal 504D of the input transistor 504 and the drain terminal 508D of the drive transistor 508. The resistor 520 includes a terminal 520B coupled to the drain terminal 506D of the input transistor 506 and the drain terminal 510D of the drive transistor 510. A terminal 520A of the resistor 520 is coupled to a terminal 5186 of the resistor 518.

The amplifier circuit 512 monitors common mode output voltage and controls the drive transistor 508 and the drive transistor 510 based on a reference voltage generated by the reference circuit 513. An input terminal 512A of the amplifier circuit 512 is coupled to the terminal 518B of the resistor 518 and the terminal 520A of the resistor 520. The output terminal 512C of the amplifier circuit 512 is coupled to the gate terminal 508G of the drive transistor 508 and the gate terminal 510G of the drive transistor 510.

The reference circuit 513 includes a current source 516 and a transistor 514. The transistor 514 is diode-connected. The source terminal 514S of the transistor 514 is coupled to the power supply rail 401. The drain terminal 514D and the gate terminal 514G of the transistor 514 are coupled to the current source 516. An input terminal 512B of the amplifier circuit 512 is coupled to the drain terminal 514D of the transistor 514. The transistor 514 is a P-channel MOSFET in some implementations of the input stage 500.

Figures 6, 7:
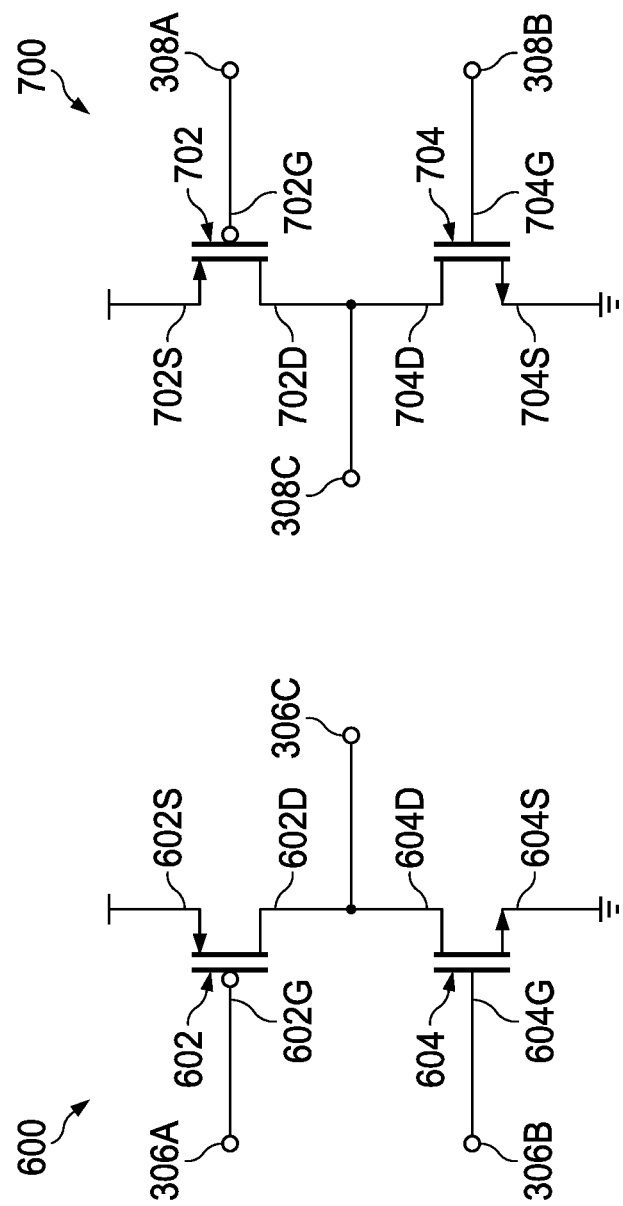
FIGS. 6 and 7 show schematic diagrams for example output stages of a class-AB line driver circuit in accordance with this description.

FIG. 6 shows a schematic diagram for an example output stage 600 in accordance with this description. The output stage 600 is an implementation of the output stage 306. The output stage 600 includes a transistor 602 and a transistor 604. The transistor 602 includes a source terminal 602S coupled to the power supply rail 401 and a gate terminal 602G coupled to the drain terminal 504D of the input transistor 504 for receipt of the signal 320. The transistor 602 is a P-channel MOSFET in some implementations of the output stage 600. The transistor 604 includes a source terminal 604S coupled to the common voltage source 403 and a gate terminal 604G coupled to the drain terminal 404D of the input transistor 404 for receipt of the signal 324. The transistor 604 is an N-channel MOSFET in some implementations of the output stage 600. The transistors 602 and 604 generate the positive signal portion 316 of the differential signal 315. Quiescent current in the output stage 600 is a function ($I_{out}=N*I_{ref}$) of the reference current ($I_{ref}$) generated by the current sources 416 and 516.

FIG. 7 shows a schematic diagram for an example output stage 700 in accordance with this description. The output stage 700 is an implementation of the output stage 308. The output stage 700 includes a transistor 702 and a transistor 704. The transistor 702 includes a source terminal 702S coupled to the power supply rail 401 and a gate terminal 702G coupled to the drain terminal 506D of the input transistor 506. The transistor 702 is a P-channel MOSFET in some implementations of the output stage 700. The transistor 704 includes a source terminal 704S coupled to the common voltage source 403 and a gate terminal 704G coupled to the drain terminal 406D of the input transistor 406. The transistor 704 is an N-channel MOSFET in some implementations of the output stage 700. The transistors 702 and 704 generate the negative signal portion 318 of the differential signal 315. Quiescent current in the output stage 700 is a function ($I_{out}=N*I_{ref}$) of the reference current ($I_{ref}$) generated by the current sources 416 and 516.

Figure 8:
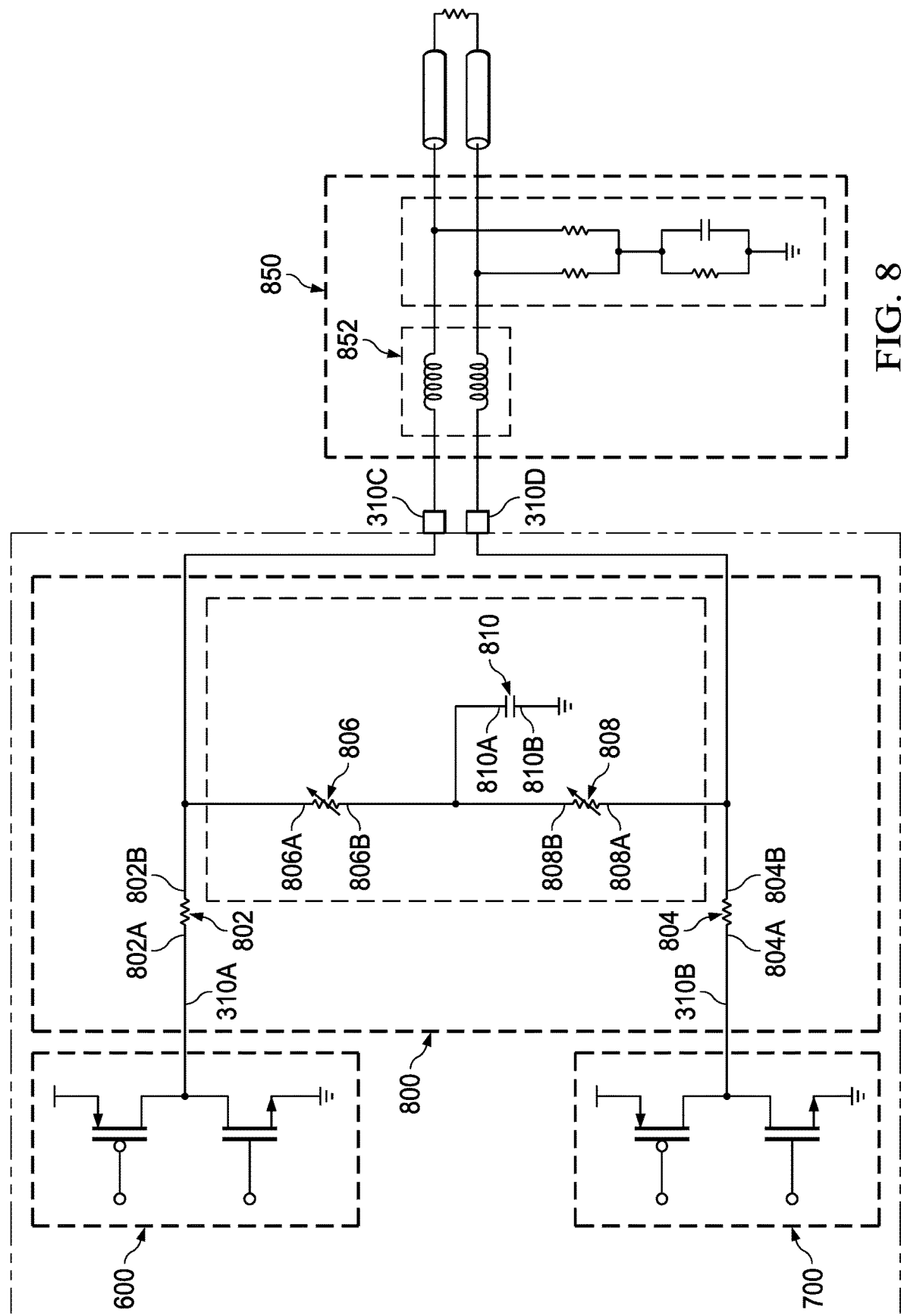
FIG. 8 shows a schematic for an example output termination network for use in a class-AB line driver circuit in accordance with this description.

FIG. 8 shows an example output termination network 800. The output termination network 800 is an implementation of the termination network 310. To provide context, the output stage 600, the output stage 700, and external components 850 are also shown in FIG. 8. The external components 850 are external to an integrated circuit that includes the output stage 600, the output stage 700, and the output termination network 800. The external components 850 includes a common mode choke 852.

The output termination network 800 includes a resistor 802, a resistor 804, a resistor 806, a resistor 808, and a capacitor 810. The resistor 802 includes a terminal 802A coupled to the output terminal 306C and a terminal 802B coupled to the output terminal 310C. The resistor 804 includes a terminal 804A coupled to the 308C and a terminal 804B coupled to the output terminal 310D. The resistor 806 includes a terminal 806A coupled to the terminal 802B of the resistor 802 and the output terminal 310C. The resistor 808 includes a terminal 808A coupled the terminal 804B of the resistor 804 and the output terminal 310D. The capacitor 810 includes a terminal 810A coupled to a terminal 806B of the resistor 806 and a terminal 808B of the resistor 808. A terminal 810B of the capacitor 810 is coupled to the common voltage source 403. In some implementations of the output termination network 800, the resistance of the resistor 802 is 50 ohms, the resistance 804 is 50 ohms, the resistance of the resistor 806 is in a range of 400 to 2000 ohms, the resistance of the resistor 808 is in a range of 400 to 2000 ohms, and the capacitance of the capacitor 810 is 30 picofarads.

At frequencies at which the class-AB line driver circuit 300 operates, e.g., 100 megahertz and greater, common mode impedance looking into the output termination network 800 from the output terminals 310C and 310D is determined by the resistors 806 and 808 because the capacitor 810 presents a low resistance. The output termination network 800 allows the common mode choke 852 to provide improved rejection of common mode signal.

Modifications are possible in the described embodiments, and other embodiments are possible, within the scope of the claims.

What is claimed is:

1. A line driver circuit, comprising:
a first input terminal;
a second input terminal;
a first input stage comprising:
 a first input coupled to the first input terminal; and
 a second input coupled to the second input terminal;
a second input stage comprising:
 a first input coupled to the first input terminal; and
 a second input coupled to the second input terminal;
a first output stage comprising:
 a first input coupled to a first output terminal of the first input stage;
 a second input coupled to a first output terminal of the second input stage; and
 a first output; and
a second output stage comprising:
 a first input coupled to a second output terminal of the first input stage;
 a second input coupled to a second output terminal of the second input stage; and
a second output;
wherein the first input stage comprises:
a current source;
a first transistor comprising:
 a first terminal coupled to the first input of the first input stage; and
 a second terminal coupled to the current source;
a second transistor comprising:
 a first terminal coupled to the second input of the first input stage; and
 a second terminal coupled to the current source;
a third transistor comprising:
 a first terminal coupled to a third terminal of the first transistor; and
 a second terminal coupled to a common voltage source;
a fourth transistor comprising:
 a first terminal coupled to a third terminal of the second transistor; and
 a second terminal coupled to the common voltage source;
a first amplifier circuit comprising:
 a first input terminal coupled to the first terminal of the third transistor and the first terminal of the fourth transistor; and
 an output terminal coupled to a third terminal of the third transistor and a third terminal of the fourth transistor.

2. The line driver circuit of claim 1, wherein:
the current source is a first current source; and
the first input stage comprises:
 a reference circuit comprising:
  a second current source;
  a fifth transistor comprising:
   a first terminal and a second terminal coupled to the second current source and a third terminal of the first amplifier circuit; and
   a third terminal coupled to the common voltage source.

3. The line driver circuit of claim 1, wherein:
the current source is a first current source; and
the second input stage comprises:
 a second current source;
 a fifth transistor comprising:
  a first terminal coupled to the first input of the second input stage; and
  a second terminal coupled to the second current source;
 a sixth transistor comprising:
  a first terminal coupled to the second input of the second input stage; and
  a second terminal coupled to the second current source;
 a seventh transistor comprising:
  a first terminal coupled to a third terminal of the fifth transistor; and
  a second terminal coupled to a power supply rail;
 an eighth transistor comprising:
  a first terminal coupled to a third terminal of the sixth transistor; and
  a second terminal coupled to the power supply rail;
 a second amplifier circuit comprising:
  a first input terminal coupled to the first terminal of the seventh transistor and the first terminal of the eighth transistor; and
  an output terminal coupled to a third terminal of the seventh transistor and a third terminal of the eighth transistor.

4. The line driver circuit of claim 3, wherein the first input stage comprises:
a reference circuit comprising:
 a third current source;
 a ninth transistor comprising:
  a first terminal and a second terminal coupled to the third current source and a third terminal of the second amplifier circuit; and
  a third terminal coupled to the power supply rail.

5. The line driver circuit of claim 3, wherein the first output stage comprises:
a ninth transistor comprising:
 a first terminal coupled to the first input of the first output stage; and
 a second terminal coupled to a power supply rail; and
a tenth transistor comprising:
 a first terminal coupled to the second input of the first output stage;
 a second terminal coupled to a third terminal of the first transistor of the first output stage; and
 a third terminal coupled to a common voltage source.

6. The line driver circuit of claim 5, wherein the second output stage comprises:
an eleventh transistor comprising:
 a first terminal coupled to the first input of the second output stage; and
 a second terminal coupled to the power supply rail;
a twelfth transistor comprising:
 a first terminal coupled to the second input of the second output stage;
 a second terminal coupled to a third terminal of the eleventh transistor; and
 a third terminal coupled to the common voltage source.

7. The line driver circuit of claim 6, further comprising:
a first output terminal;
a second output terminal;
a first resistor comprising:
 a first terminal coupled to the first output of the first output stage; and
 a second terminal coupled to the first output terminal;

a second resistor comprising:
  a first terminal coupled to the second output of the second output stage; and
  a second terminal coupled to the second output terminal;
a third resistor comprising a first terminal coupled to the first output terminal;
a fourth resistor comprising:
  a first terminal coupled to the second output terminal; and
  a second terminal coupled to a second terminal of the third resistor; and
a capacitor comprising:
  a first terminal coupled to the second terminal of the fourth resistor; and
  a second terminal coupled to the common voltage source.

8. A line driver circuit, comprising:
a first differential input stage configured to receive a differential input signal;
a second differential input stage configured to receive the differential input signal;
a first output stage coupled to the first differential input stage and the second differential input stage, and configured to generate a positive signal portion of a differential output signal based on a first signal generated by the first differential input stage and a second signal generated by the second differential input stage; and
a second output stage coupled to the first differential input stage and the second differential input stage, and configured to generate a negative signal portion of the differential output signal based on a third signal generated by the first differential input stage and a fourth signal generated by the second differential input stage;
wherein the first differential input stage comprises:
a first input transistor;
a second input transistor coupled to the first input transistor;
a first drive transistor coupled to the first input transistor;
a second drive transistor coupled to the second input transistor; and
an amplifier circuit configured to control the first drive transistor and the second drive transistor based on a common mode output voltage of the first differential input stage.

9. The line driver circuit of claim 8, wherein the first differential input stage comprises a reference circuit coupled to the amplifier circuit.

10. A line driver circuit, comprising:
a first differential input stage configured to receive a differential input signal;
a second differential input stage configured to receive the differential input signal;
a first output stage coupled to the first differential input stage and the second differential input stage, and configured to generate a positive signal portion of a differential output signal based on a first signal generated by the first differential input stage and a second signal generated by the second differential input stage; and
a second output stage coupled to the first differential input stage and the second differential input stage, and configured to generate a negative signal portion of the differential output signal based on a third signal generated by the first differential input stage and a fourth signal generated by the second differential input stage;
wherein the second differential input stage comprises:
a first input transistor;
a second input transistor coupled to the first input transistor;
a first drive transistor coupled to the first input transistor;
a second drive transistor coupled to the second input transistor; and
an amplifier circuit configured to control the first drive transistor and the second drive transistor based on a common mode output voltage of the second differential input stage.

11. The line driver circuit of claim 10, wherein the first differential input stage comprises a reference circuit coupled to the amplifier circuit.

12. A class AB automotive Ethernet driver, comprising:
a first input terminal and a second input terminal configured to receive a differential input signal;
a first differential input stage configured to receive the differential input signal;
a second differential input stage configured to receive the differential input signal;
a first output stage coupled to the first differential input stage and the second differential input stage, and configured to generate a positive signal portion of a differential output signal based on a first signal generated by the first differential input stage and a second signal generated by the second differential input stage; and
a second output stage coupled to the first differential input stage and the second differential input stage, and configured to generate a negative signal portion of the differential output signal based on a third signal generated by the first differential input stage and a fourth signal generated by the second differential input stage;
a common mode termination network;
a first output terminal coupled to the first output stage and the second output stage via the common mode termination network; and
a second output terminal coupled to the first output stage and the second output stage via the common mode termination network;
wherein the first differential input stage comprises:
a first input transistor;
a second input transistor coupled to the first input transistor;
a first drive transistor coupled to the first input transistor;
a second drive transistor coupled to the second input transistor; and
a first amplifier circuit configured to control the first drive transistor and the second drive transistor based on a common mode output voltage of the first differential input stage.

13. The class AB automotive Ethernet driver of claim 12, wherein the second differential input stage comprises:
a third input transistor;
a fourth input transistor coupled to the first input transistor;
a third drive transistor coupled to the first input transistor;
a fourth drive transistor coupled to the second input transistor; and
a second amplifier circuit configured to control the third drive transistor and the fourth drive transistor based on a common mode output voltage of the second differential input stage.

14. The class AB automotive Ethernet driver of claim 13, wherein:
the first differential input stage comprises a first reference circuit coupled to the first amplifier circuit; and
the second differential input stage comprises a second reference circuit coupled to the second amplifier circuit.

* * * * *